(12) United States Patent
Guan

(10) Patent No.: US 8,077,458 B2
(45) Date of Patent: Dec. 13, 2011

(54) AIRFLOW GUIDING COVER AND ELECTRONIC DEVICE HAVING THE SAME

(75) Inventor: Zhi-Bin Guan, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 0 days.

(21) Appl. No.: 12/626,576

(22) Filed: Nov. 25, 2009

(65) Prior Publication Data

US 2010/0290187 A1  Nov. 18, 2010

(30) Foreign Application Priority Data

May 15, 2009  (CN) .......................... 2009 1 0302339

(51) Int. Cl.
*H05K 7/20* (2006.01)
(52) U.S. Cl. ........ 361/695; 361/692; 361/697; 454/184; 415/186
(58) Field of Classification Search .................. 361/690, 361/692, 694, 695, 697
See application file for complete search history.

(56) References Cited

U.S. PATENT DOCUMENTS

| | | | | |
|---|---|---|---|---|
| 5,957,194 A * | 9/1999 | Azar | ............................ | 165/80.3 |
| 6,104,608 A * | 8/2000 | Casinelli et al. | .............. | 361/692 |
| 6,154,368 A * | 11/2000 | Scofield | ........................ | 361/719 |
| 6,504,718 B2 * | 1/2003 | Wu | ................. | 361/695 |
| 6,667,883 B1 * | 12/2003 | Solis et al. | ..................... | 361/695 |
| 6,678,157 B1 * | 1/2004 | Bestwick | ....................... | 361/695 |
| 6,914,779 B2 * | 7/2005 | Askeland et al. | ......... | 361/679.51 |
| 6,958,906 B2 * | 10/2005 | Wu et al. | ..................... | 361/679.5 |
| 7,209,352 B2 * | 4/2007 | Chen | .............................. | 361/695 |
| 7,408,773 B2 * | 8/2008 | Wobig et al. | .................. | 361/695 |
| 7,474,528 B1 * | 1/2009 | Olesiewicz et al. | ........... | 361/695 |
| 7,848,105 B2 * | 12/2010 | Holmes et al. | ................ | 361/695 |
| 2007/0230114 A1 * | 10/2007 | Bartell et al. | ................. | 361/687 |
| 2007/0235168 A1 * | 10/2007 | Chen et al. | ..................... | 165/124 |

* cited by examiner

*Primary Examiner* — Courtney Smith
(74) *Attorney, Agent, or Firm* — Altis Law Group, Inc.

(57) ABSTRACT

An electronic device includes a base, a motherboard having an electronic component, a fan unit, and an airflow guiding cover. The airflow cover includes a top panel and two side panels. An air channel is bounded by the top panel and the side panels. The electronic component is received in the air channel. The air channel includes opposite open ends. The fan unit aligns with one of the open ends of the air channel, to draw airflow in the air channel out. The top panel defines a plurality of through holes adjacent to the fan unit, to discharge a part of the airflow in the air channel out of the airflow guiding cover, for reducing change of the pressure gradient of the airflow, thereby reducing aerodynamic noise.

4 Claims, 3 Drawing Sheets

AIRFLOW GUIDING COVER AND ELECTRONIC DEVICE HAVING THE SAME

BACKGROUND

1. Technical Field

The present disclosure relates to an electronic device with an airflow guiding cover.

2. Description of Related Art

An electronic device, such as a computer or a server, generally includes an airflow guiding cover over a heat generating component. A fan is mounted adjacent to an opening of the airflow guiding cover, to discharge heat produced by the heat generating component out of the airflow guiding cover. However, when the fan is operating, the pressure gradient of the airflow in the electronic device changes acutely, which causes aerodynamic noise.

DETAILED DESCRIPTION

Figure 1:
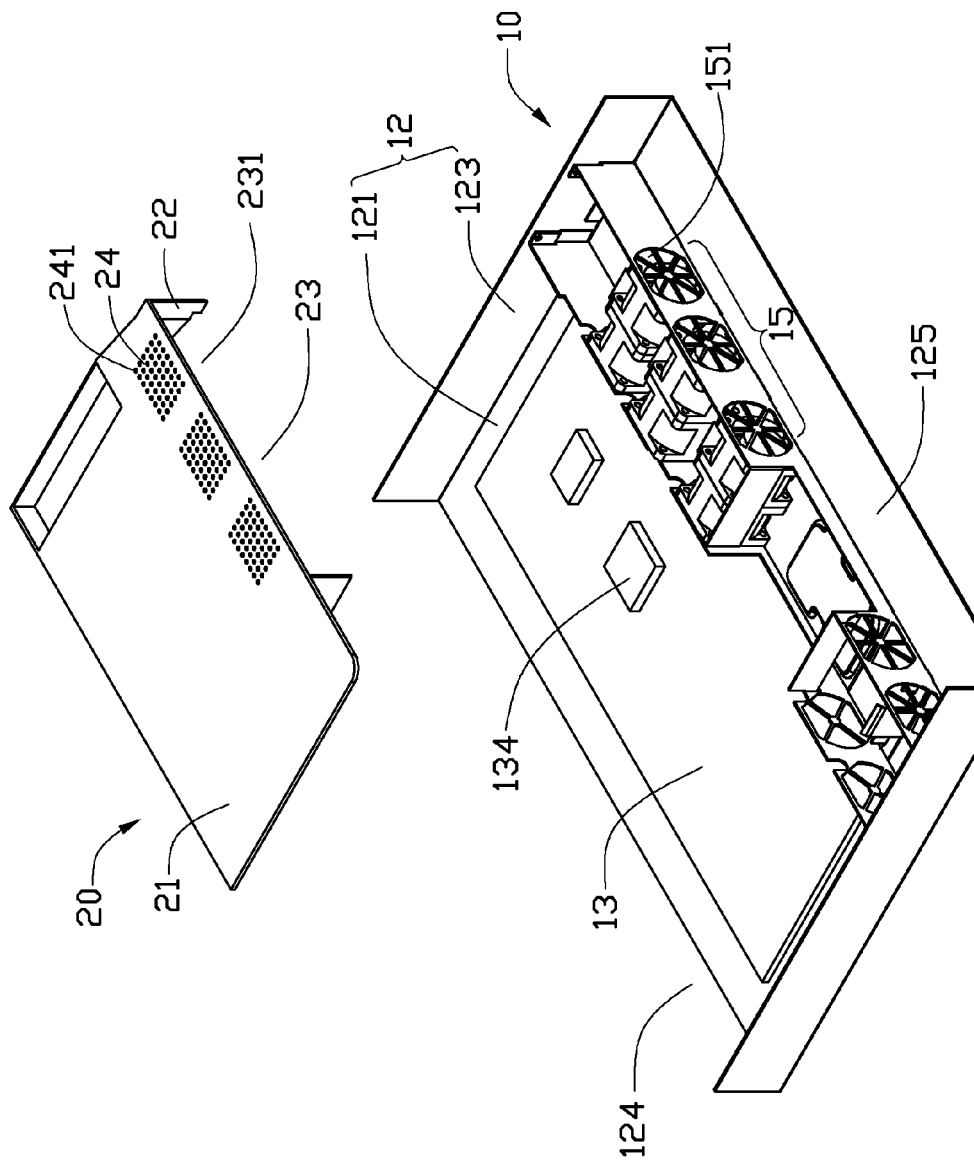
FIG. 1 is an exploded, isometric view of a first embodiment of an electronic device with an airflow guiding cover.
Figure 2:
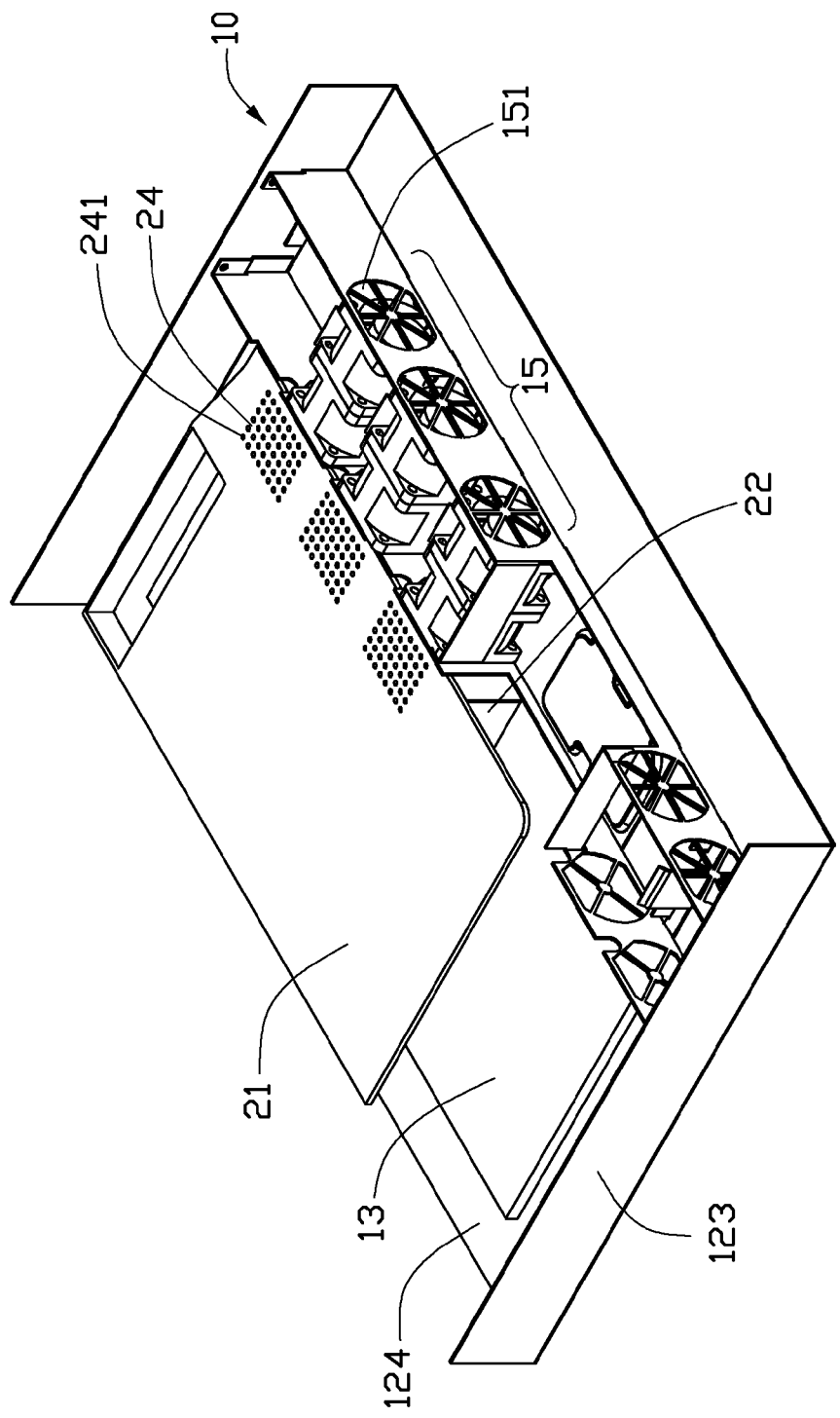
FIG. 2 is an assembled, isometric view of the electronic device of FIG. 1.

Referring to FIGS. 1 and 2, an electronic device 10 according to a first embodiment of the present disclosure includes a base 12, a motherboard 13, a plurality of fans 151, and an airflow guiding cover 20.

The base 12 includes a bottom wall 121, and two opposite sidewalls 123 extending from opposite ends of the bottom wall 121. A first opening 124 is defined on a side of the base 12 between the sidewalls 123, and a second opening 125 is defined on an side of the base 12 opposite to the first opening 124 between the sidewalls 123. The motherboard 13 is installed on the bottom wall 121. A plurality of electronic components 134 is mounted to the motherboard 13. The plurality of fans 151 cooperates to make up a fan unit 15, and is mounted to the bottom wall 121 adjacent to the second opening 125, for drawing heat produced by the plurality of electronic components 134 out of the electronic device 10. The airflow guiding cover 20 includes a top panel 21 and two opposite side panels 22 perpendicularly extending down from the top panel 21. An air channel 23 having opposite open ends 231 is bounded by the top panel 21 and the side panels 22. A plurality of spaced acoustic damping areas 24 is defined in the top panel 21, adjacent to one of the open ends 231. Each acoustic damping area 24 includes a plurality of rectangular-arrayed through holes 241.

The airflow guiding cover 20 is mounted to the motherboard 13, the plurality of electronic components 134 is received in the air channel 23 of the airflow guiding cover 20, the plurality of fans 151 of the fan unit 15 aligns with one of the open ends 231 adjacent to the plurality of acoustic damping areas 24 of the airflow guiding cover 20, and the other one of the open ends 231 of the air channel 23 aligns with the first opening 124 of the base 12. The plurality of acoustic damping areas 24 correspondingly aligns with tops of the plurality of fans 151.

In use, air out of the electronic device 10 is directed into the air channel 23 of the airflow guiding cover 20 through the first opening 124. After the air passes through the plurality of electronic components 134, the air is heated through heat exchange with the plurality of electronic components 134. The plurality of fans 151 operates to draw the hot air out of the air channel 23 of the airflow guiding cover 20 and the electronic device 10, through the second opening 125 of the base 12. In this process, the pressure gradient of the airflow in the electronic device 10 changes, and the pressure gradient of the airflow at the open end 231 of the air channel 23 adjacent to the plurality of fans 151 changes most. The plurality of through holes 241 of the plurality of acoustic damping areas 24 adjacent to the plurality of fans 151 discharges a part of the hot air in the air channel 23 out of the airflow guiding cover 20 for reducing the change of the pressure gradient of the airflow, thereby reducing aerodynamic noise.

Figure 3:
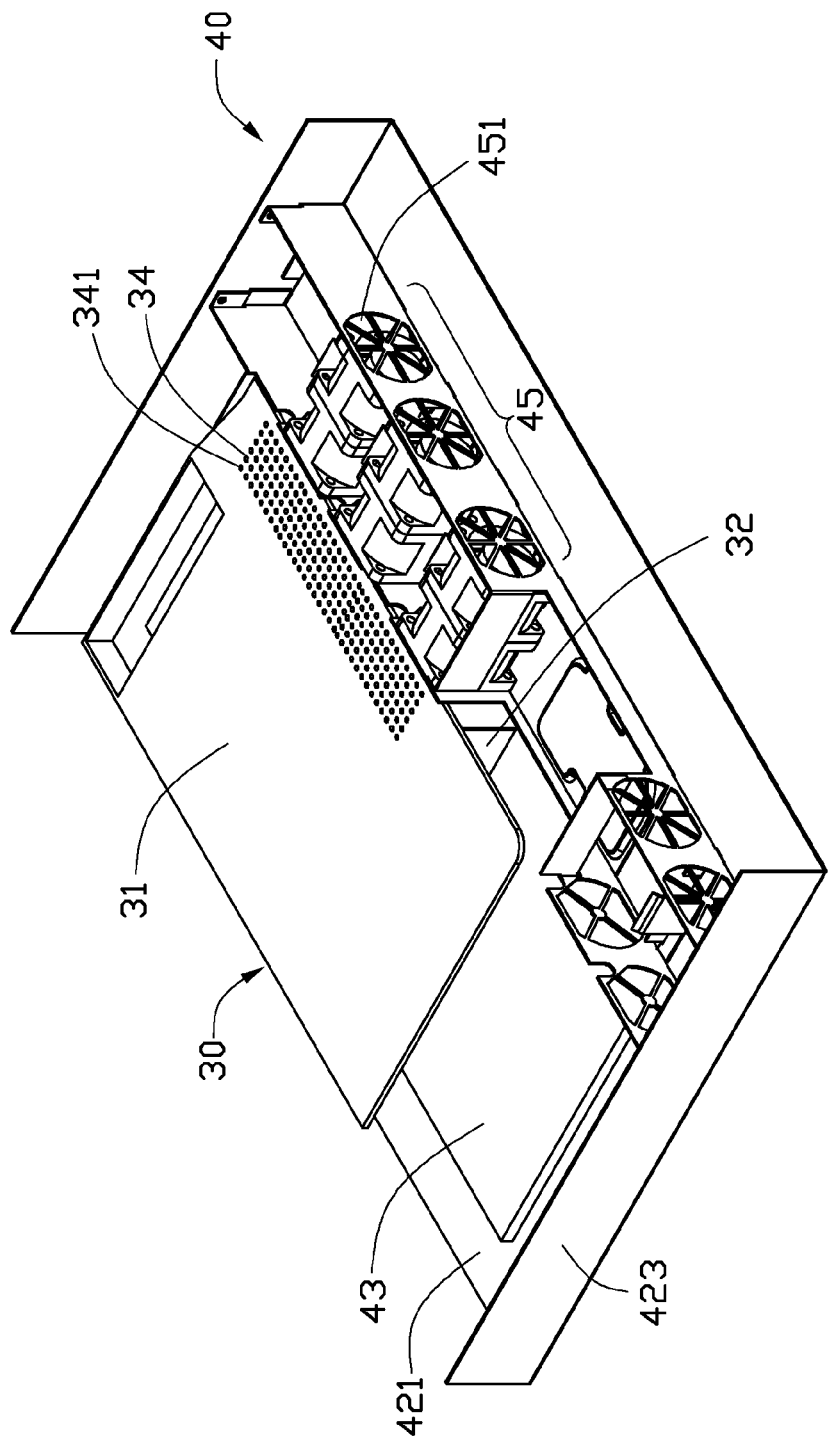
FIG. 3 is an assembled, isometric view of a second embodiment of an electronic device with an airflow guiding cover.

Referring to FIG. 3, an electronic device 40 according to a second embodiment of the present disclosure includes a bottom wall 421, two sidewalls 423, a motherboard 43, a fan unit 45 including a plurality of fans 451, and an airflow guiding cover 30. The bottom wall 421, the sidewalls 423, the motherboard 43, and the fan unit 45 have the same structures as corresponding components in the first embodiment. The airflow guiding cover 30 includes a top panel 31 and two side panels 32 perpendicularly extending down from the top panel 31. An acoustic damping area 34 is defined in the top panel 31 adjacent to the plurality of fans 451. The acoustic damping area 34 includes a plurality of rectangular arrayed through holes 341. The plurality of through holes 341 aligns with tops of the fans 451. Compared to the first embodiment, there are more through holes 341 of the airflow guiding cover 30 of the second embodiment than through holes 241 of the plurality of acoustic damping areas 24 of the airflow guiding cover 20 of the first embodiment. The plurality of through holes 341 of the airflow guiding cover 30 of the second embodiment can discharge more hot air out of the airflow guiding cover 30, which will cause a better acoustic damping effect if needed or desired.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An electronic device, comprising:
    a base;
    a motherboard installed on the base and comprising an electronic component;
    a fan unit mounted to the base; and
    an airflow guiding cover covering the motherboard, the airflow guiding cover comprising a top panel, two opposite side panels perpendicularly extending down from the top panel, and an air channel bounded by the top panel and the side panels, wherein the air channel comprises opposite open ends, the electronic component is received in the air channel, one of the open ends of the air channel aligns with the fan unit, and a plurality of through holes is defined in the top panel adjacent to the fan unit, wherein the fan unit comprises a plurality of fans, the plurality of through holes of the airflow guiding cover forms a plurality of spaced areas correspondingly aligning with tops of the plurality of fans.

2. The electronic device of claim 1, wherein the through holes of each area are rectangular-arrayed.

3. The electronic device of claim 1, wherein the base forms a first opening, the fan unit is mounted to the base adjacent to the first opening, to draw airflow in the air channel from the base through the first opening.

4. The electronic device of claim 3, wherein the base forms a second opening opposite to the first opening, the other one of the open ends of the air channel aligns with the second opening.

* * * * *